(12) United States Patent
Jung et al.

(10) Patent No.: US 7,767,974 B2
(45) Date of Patent: Aug. 3, 2010

(54) THIN-FILM TRANSISTOR ARRAY SUBSTRATE FOR X-RAY DETECTOR AND X-RAY DETECTOR HAVING THE SAME

(75) Inventors: Kwan-Wook Jung, Suwon-si (KR); Dae-Ho Choo, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 42 days.

(21) Appl. No.: 12/136,398

(22) Filed: Jun. 10, 2008

(65) Prior Publication Data

US 2008/0302969 A1    Dec. 11, 2008

(30) Foreign Application Priority Data

Jun. 11, 2007    (KR) .................. 10-2007-0056451

(51) Int. Cl.
*H01L 27/146* (2006.01)

(52) U.S. Cl. .................................. 250/370.09

(58) Field of Classification Search ............. 250/370.09
See application file for complete search history.

(56) References Cited

U.S. PATENT DOCUMENTS 6,353,228 B1    3/2002    Itabashi

2007/0007458 A1*    1/2007    Mochizuki et al. ..... 250/370.09
2007/0210257 A1*    9/2007    Masuda et al. ......... 250/370.09

FOREIGN PATENT DOCUMENTS

| JP | 560871 | 3/1993 |
|---|---|---|
| JP | 11345994 | 12/1999 |

* cited by examiner

*Primary Examiner*—David P Porta
*Assistant Examiner*—Mindy Vu
(74) *Attorney, Agent, or Firm*—Cantor Colburn LLP (57) ABSTRACT

In a thin-film transistor ("TFT") array substrate for an X-ray detector and an X-ray detector having the TFT array substrate, the TFT array substrate includes a gate wiring, a gate insulating layer, an active layer, a data wiring, a photodiode, an organic insulating layer and a bias wiring. The gate wiring is formed on an insulating substrate and includes a gate line and a gate electrode. The gate insulating layer covers the gate wiring. The active layer is formed on the gate insulating layer. The data wiring is formed on the gate insulating layer and includes a data line, source and drain electrodes. The photodiode includes lower and upper electrodes, and a photoconductive layer. The organic insulating layer covers the data wiring and the photodiode. The bias wiring is formed on the organic insulating layer. Thus, an aperture ratio and reliability are enhanced.

17 Claims, 6 Drawing Sheets

THIN-FILM TRANSISTOR ARRAY SUBSTRATE FOR X-RAY DETECTOR AND X-RAY DETECTOR HAVING THE SAME

This application claims priority to Korean Patent Application No. 2007-56451, filed on Jun. 11, 2007, and all the benefits accruing therefrom under 35 U.S.C. §119, the contents of which in its entirety are herein incorporated by reference.

BACKGROUND OF THE INVENTION

1. Field of the Invention

The present invention relates to a thin-film transistor ("TFT") array substrate for an X-ray detector and the X-ray detector having the TFT array substrate. More particularly, the present invention relates to the TFT array substrate for the X-ray detector capable of improving reliability and the X-ray detector having the TFT array substrate.

2. Description of the Related Art

A scintillator converts an X-ray which is emitted from an X-ray source and passes through an object according to the density of the object, into green light which is a visible ray. Diagnostic radiography is a conventional method through which an amount of electrical charge is detected when the light having passed through the scintillator, passes through a light-conversion sensor and the amount of the electrical charge is converted into a digital signal. Diagnostic radiography is classified into an image processing method and a storage method, or an analog-type and a digital-type diagnostic radiography.

Analog-type diagnostic radiography uses a photosensitive film as media on which an image is stored. For example, a contrast ratio is changed according to a difference of brightness which develops according to a level of exposure by using the image stored on the photosensitive film.

Digital-type diagnostic radiography is classified into computed radiography ("CR") and digital radiography ("DR").

CR directly stores an image emitted from a scintillator by using a magnetic material or a fluorescent material as an image storage sensor, and then displays the image on a display device by processing the image through a scanner. CR uses a digital image processing method, but does not substantially display a digital image because CR uses a scanner. For example, CR includes limitations in that digital image processing has limited editing functions, simultaneous transmitting functions, and the ability to achieve high contrast ratios.

On the other hand, DR is used for basic image processing in a medical diagnostic device. DR is classified into charge-coupled device ("CCD") DR, complementary metal-oxide semiconductor ("CMOS") DR and flat panel ("FP") DR according to a type of sensor that converts the green light emitted from the scintillator.

The three types of DR use the same basic principles for digital image processing. For example, after a visible ray, emitted from an X-ray source and passing through an object and a scintillator is classified according to pixel, and is incident into a DR detecting sensor, a light-conversion apparatus stores amounts of electrical charge into each pixel. Then, an analog-to-digital converter ("ADC") converts the amounts of electrical charge stored in each pixel into a digital signal, to process a digital image.

CCD and CMOS DR use relatively small sensors, so that an image has to be enlarged when performing digital image processing. Thus, projection-type DR has disadvantages with regard to resolution, brightness, contrast ratio and so on. CCD and CMOS DR correspond to methods used in large-size televisions, such as digital light processing ("DLP")-type televisions and liquid crystal display ("LCD")-type televisions.

A DR method using flat panel glass produces an X-ray image having the best quality, by allowing matching with a photoelectric sensor at a 1:1 ratio. Flat panel X-ray detecting ("FPXD")-type DR is the most advanced type of DR. FPXD DR is classified into a direct-type and an indirect-type.

Direct-type DR directly biases a photoelectric charge which is converted by a scintillator to a thin-film transistor ("TFT") circuit by using the TFT circuit, and induces the photoelectric charge in the TFT circuit, to induce a photoelectric current. Then, the photoelectric current is processed into a digital image through an ADC. For example, direct-type DR uses a simple structure in which a scintillator having amorphous selenium ("a-Se")-based material directly attached to the TFT circuit and the TFT circuit are directly biased. However, direct-type DR has a disadvantage in that the scintillator having the amorphous selenium-based material which includes high photoelectric conversion efficiency has to be directly coated on the TFT circuit.

In addition, the scintillator having the amorphous selenium-based material that has the high photoelectric conversion efficiency is vulnerable to heat generated in operating the TFT circuit, so that the detection ability of the scintillator may be deteriorated.

Indirect-type DR includes the use of an X-ray detector. Each pixel of the X-ray detector includes a p-type photoconductive layer implanted with p-type impurities, a photoconductive layer having no impurities, an n-type photoconductive layer implanted with n-type impurities, and a positive-intrinsic-negative ("PIN") photodiode having two electrodes to apply a voltage to both ends of the conductive layer. A scintillator is formed on the structure. The X-ray detector applies electrons that are generated from the PIN photodiode by an externally irradiated X-ray, and generates a bias voltage to an outside, to convert the light into an electrical signal.

Particularly, in indirect-type DR, the light emitted from an X-ray source passes through an object and is converted into a green light in a cesium iodide: thallium ("CsI:Tl") scintillator. Then, when the light is incident into an intrinsic silicon layer of a PIN junction diode on a flat panel, electrons and holes are generated in the silicon. An upper layer of a p-type silicon ("p-Si") layer is biased by a negative voltage between approximately 5 V and approximately 7 V, the electrons of a negative charge move toward the direction of an n-type silicon ("n-Si") layer different from that of the p-Si layer. The electrons moved to the n-Si layer pass through a source-drain layer on the TFT substrate and are integrated on a read-out integrated circuit ("ROIC"). A gate layer of the TFT circuit is driven to read the integrated electrons.

A signal read from each pixel as mentioned above, is an analog signal having a photocurrent unit. The analog signal is different according to a quantity of light incident into each pixel unit. For example, the intensity of an X-ray incident into the scintillator differs according to the density of the object. The analog signal that differs according to the quantity of light and the pixel unit, is digitized through the ADC, so that a digital image is displayed on a screen.

The photoelectric conversion efficiency of a PIN photodiode, and the efficiency of a scintillator converting an X-ray into a visible ray are limited. In addition, leakage current may occur in the X-ray detector.

BRIEF SUMMARY OF THE INVENTION

The present invention has made an effort to solve the above stated problems and aspects of the present invention provide a thin-film transistor ("TFT") array substrate for an X-ray detector capable of enhancing photoelectric conversion efficiency.

In an exemplary embodiment, the present invention provides an X-ray detector having the TFT array substrate.

In an exemplary embodiment, the present invention provides a TFT array substrate for the X-ray detector which includes a gate wiring, a gate insulating layer, an active layer, a data wiring, a photodiode, an organic insulating layer and a bias wiring. The gate wiring is formed on an insulating substrate and includes a gate line and a gate electrode electrically connected to the gate line. The gate insulating layer covers the gate wiring. The active layer is formed on the gate insulating layer to overlap with the gate electrode. The data wiring is formed on the gate insulating layer, and includes a data line, a source electrode and a drain electrode. The data line crosses the gate line. The source electrode is electrically connected to the data line and extends to an upper portion of the active layer. The drain electrode is spaced apart from the source electrode on the active layer. The photodiode is formed in a pixel area, and includes a lower electrode electrically connected to the drain electrode, a photoconductive layer formed on the lower electrode, which generates electrons and holes using an externally provided light, and an upper electrode formed on the photoconductive layer. The organic insulating layer covers the data wiring and the photodiode and comprising a contact hole. The bias wiring is formed on the organic insulating layer and is electrically connected to the upper electrode through the contact hole formed through the organic insulating layer.

According to another exemplary of the present invention, the bias wiring extends substantially parallel with the data line, and at least a portion of the bias wiring is close to the data line to overlap with the data line.

According to an exemplary embodiment, the TFT array substrate further includes a passivation insulating layer formed beneath the organic insulating layer, which contacts with the organic insulating layer.

According to an exemplary embodiment, the TFT array substrate further includes an auxiliary bias wiring electrically connected to the bias wiring and perpendicularly crossing the bias wiring which prevents a malfunction of the TFT array substrate when the bias wiring becomes disconnected.

According to another exemplary embodiment, the present invention provides an X-ray detector which includes a TFT array substrate and an X-ray generator. The TFT array substrate includes a gate wiring, a gate insulating layer, an active layer, a data wiring, a photodiode, an organic insulating layer and a bias wiring. The gate wiring is formed on an insulating substrate, and includes a gate line and a gate electrode electrically connected to the gate line. The gate insulating layer covers the gate wiring. The active layer is formed on the gate insulating layer to overlap with the gate electrode. The data wiring is formed on the gate insulating layer, and includes a data line, a source electrode and a drain electrode. The data line crosses the gate line. The source electrode is electrically connected to the data line and extending to an upper portion of the active layer. The drain electrode is spaced apart from the source electrode on the active layer. The photodiode is formed in a pixel area, and includes a lower electrode electrically connected to the drain electrode. A photoconductive layer is formed on the lower electrode, which generates electrons and holes using externally provided light, and an upper electrode is formed on the photoconductive layer. The organic insulating layer covers the data wiring and the photodiode. The bias wiring is formed on the organic insulating layer and is electrically connected to the upper electrode through a contact hole that is formed through the organic insulating layer. The X-ray generator generates an X-ray and irradiates the X-ray onto the TFT array substrate.

According to an exemplary embodiment, when a passivation insulating layer and an organic insulating layer are used at the same time, a bias wiring partially overlaps with a data wiring, so that an area of a PIN photodiode is maximized and leakage current is minimized. Thus, the electric characteristics of the X-ray detector are enhanced.

According to an exemplary embodiment, an auxiliary bias wiring is also formed, to enhance the reliability of the X-ray detector.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

The present invention will now be more fully described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
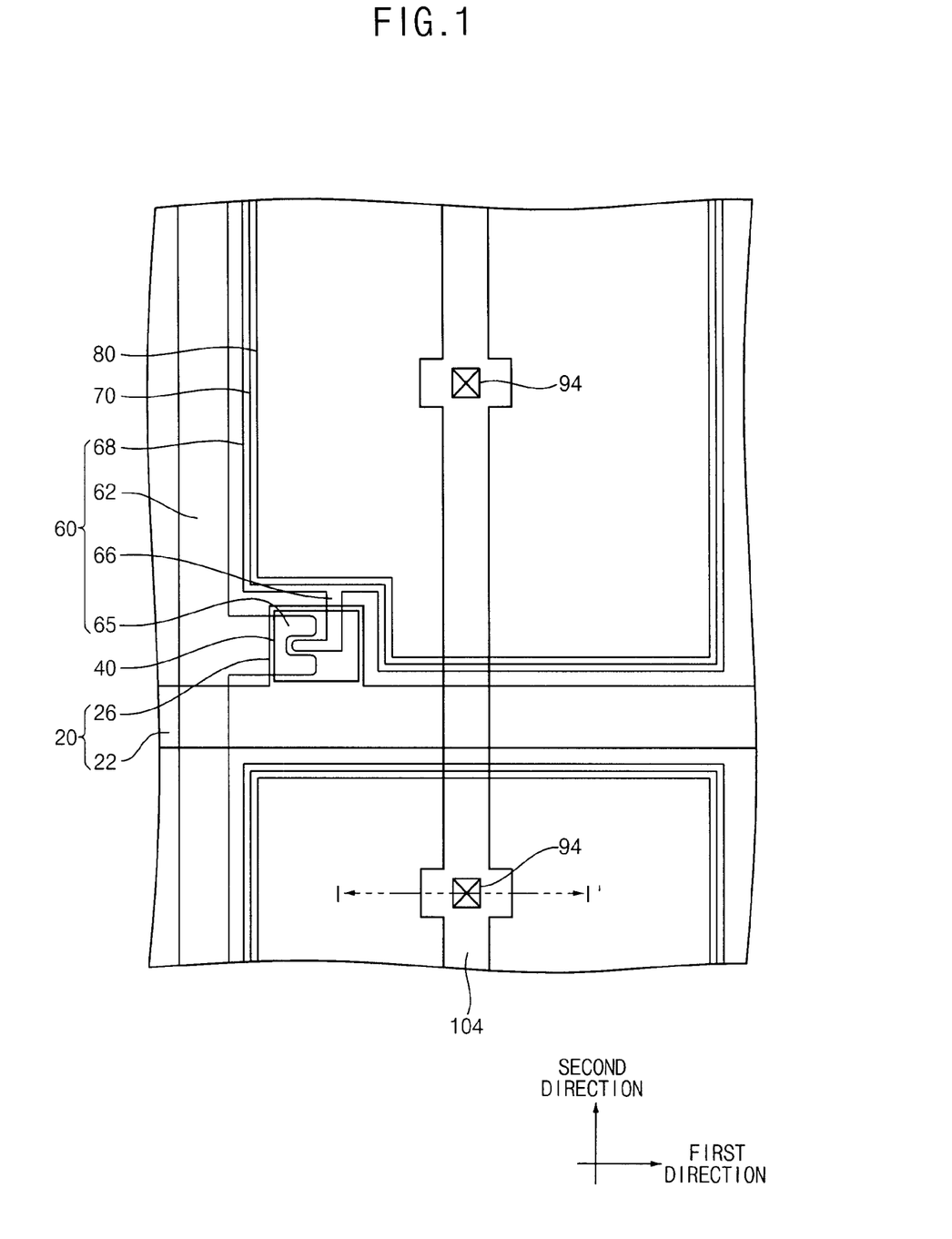
FIG. 1 is a plan view illustrating an exemplary embodiment of a thin-film transistor (TFT) array substrate for an X-ray detector according to the present invention.
Figure 2:
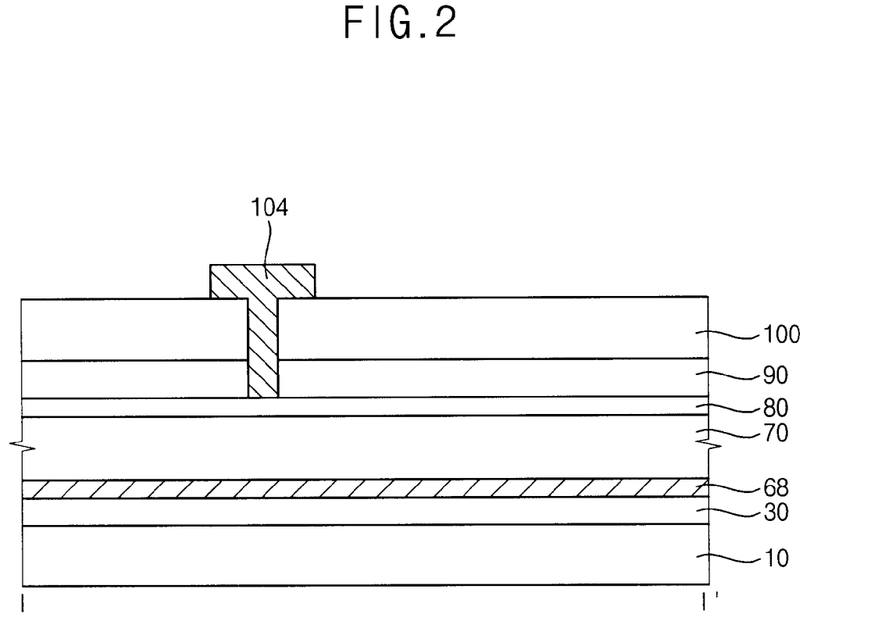
FIG. 2 is a cross-sectional view taken along a line I-I' of FIG. 1.

FIG. 1 is a plan view illustrating an exemplary embodiment of a thin-film transistor (TFT) array substrate for an X-ray detector according to the present invention. FIG. 2 is a cross-sectional view taken along a line I-I' of FIG. 1.

Referring to FIGS. 1 and 2, a gate wiring 20 includes an aluminum-based metallic material having a low resistance, and is formed on an insulating substrate 10. The gate wiring 20 includes a gate line 22 extending along a first direction, and a gate electrode 26 of a TFT electrically connected to the gate line 22. According to an exemplary embodiment, the gate wiring 20 is connected to an end portion of the gate line 22, and further includes a gate pad which receives an externally provided gate signal and transmits the gate signal to the gate line 22.

A gate insulating layer 30 including silicon nitride ("SiNx") covers the gate wiring 20 on the insulating substrate 10.

An active layer 40 is formed on the gate insulating layer 30 to overlap with the gate electrode 26. According to an exemplary embodiment, the active layer 40 includes a semiconductor layer which includes a semiconductor such as amorphous silicon, and a resistant contact layer including silicide or n+ hydrogenated amorphous silicon doped with n-type dopants at a high concentration. According to an exemplary embodiment, the active layer 40 extends to a crossing portion between a data line 62 and a gate line 22.

As shown in FIG. 1, a data wiring 60 includes a metal such as molybdenum (Mo), a molybdenum-tungsten ("MoW") alloy, chromium (Cr), tantalum (Ta), or titanium (Ti), for example, is formed on the active layer 40 and the gate insulating layer 30. The data wiring 60 is a branch of the data line 62 extending along a second direction substantially perpendicular to the first direction and crossing the gate line 22. The data wiring 60 includes a source electrode 65 which extends to an upper portion of the active layer 40, and a drain electrode 66 spaced apart from the source electrode 65 on the upper portion of the active layer 40. According to an exemplary embodiment, the data wiring 60 is connected to an end portion of the data line 62 and further includes a data pad receiving an externally provided image signal. In addition, the data wiring 60 is formed in a pixel area on the gate insulating layer 30, and includes a lower electrode 68 of a positive-intrinsic-negative ("PIN") photodiode connected to the drain electrode 66.

According to an exemplary embodiment, when the data wiring 60 includes more than two layers, a first layer of the data wiring 60 includes an aluminum-based conductive material having the low resistance, and a second layer of the data wiring 60 includes a material making good contact with adjacent materials. For example, according to an exemplary embodiment, the second layer includes a chromium-aluminum ("Cr—Al") alloy, an aluminum-molybdenum ("Al—Mo") alloy, an aluminum (Al) alloy and so on.

A photoconductive layer 70 is formed on the lower electrode 68 of the PIN photodiode. The photoconductive layer 70 includes an amorphous silicon layer having n-type impurities, an intrinsic amorphous silicon layer not having impurities, and an amorphous silicon layer having p-type impurities. The photoconductive layer 70 generates electrons or holes using externally provided light.

An upper electrode 80 of the PIN photodiode having a transparent conductive material, such as indium tin oxide ("ITO") or indium zinc oxide ("IZO"), is formed on the photoconductive layer 70.

According to the current embodiment, the lower electrode 68, the photoconductive layer 70 and the upper electrode 80 form the PIN photodiode.

A passivation insulating layer 90 having silicon nitride ("SiNx") or silicon oxide ("SiOx"), is formed on the insulating substrate 10 on which the data wiring 60 and the PIN photodiode are formed. A layer including silicon nitride ("SiNx") or silicon oxide ("SiOx") is difficult to form to a thickness greater than approximately 5,000 Å due to stress applied to a layer. Thus, it is difficult for the layer to absorb a stepped portion of the PIN photodiode, so that a thin-film structure that is formed to follow the layer becomes vulnerable to external forces. In addition, silicon nitride ("SiNx") or silicon oxide ("SiOx") includes a high dielectric constant, such that leakage current may occur.

Thus, in the current exemplary embodiment, an organic insulating layer 100 having a low dielectric constant includes a thickness greater than approximately 2 μm on the passivation insulating layer 90. For example, according to an exemplary embodiment, the thickness of the organic insulating layer 100 is between approximately 2 μm and approximately 3 μm.

According to an exemplary embodiment, when the passivation insulating layer 90 and the organic insulating layer 100 are used at the same time, the organic insulating layer 100 includes a low dielectric constant which is equal to or lower than approximately 4.0 and includes a thickness which is equal to or greater than approximately 2 μm, such that leakage current between the lower electrode 68 and a bias wiring 104 in the PIN photodiode is minimized. Thus, the leakage current from the upper surface of the active layer 40 may be minimized, so that electric characteristics of the TFT may be enhanced. Alternatively, according to another exemplary embodiment, the organic insulating layer is only used for an insulating interlayer without the passivation insulating layer 90.

According to an exemplary embodiment, a contact hole 94 is formed through the passivation layer 90 and the organic insulating layer 100, to partially expose the upper electrode 80.

The bias wiring 104 extends along the second direction, and is formed on the organic insulating layer 100. The bias wiring 104 contacts with the upper electrode 80 through the contact hole 94. In the current exemplary embodiment, the bias wiring 104 transmits a bias voltage to the upper electrode 80. The bias voltage controls the electrons and the holes generated from the photoconductive layer 70.

Figure 3:
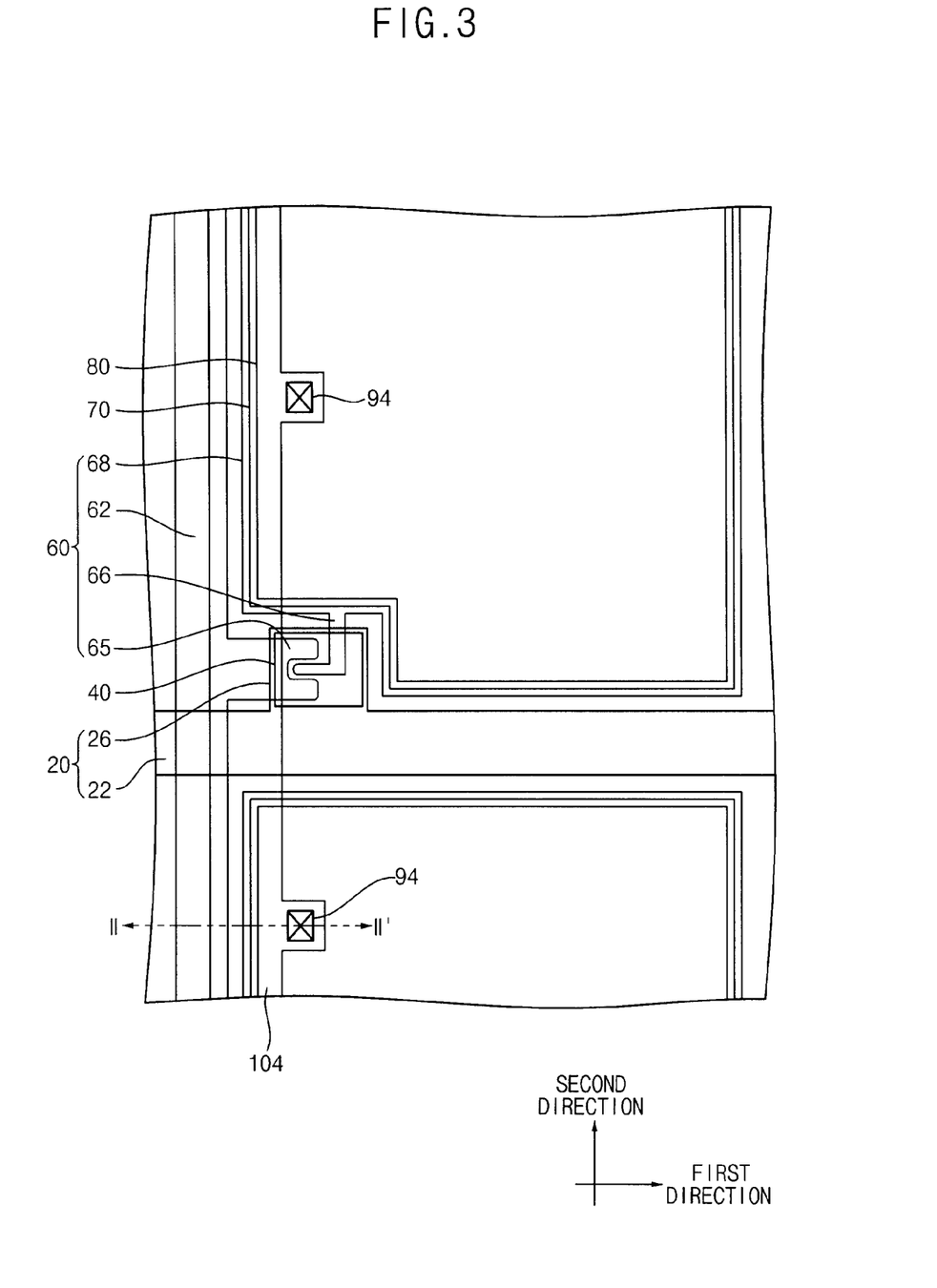
FIG. 3 is a plan view illustrating another exemplary embodiment of a TFT array substrate for an X-ray detector according to the present invention.
Figure 4:
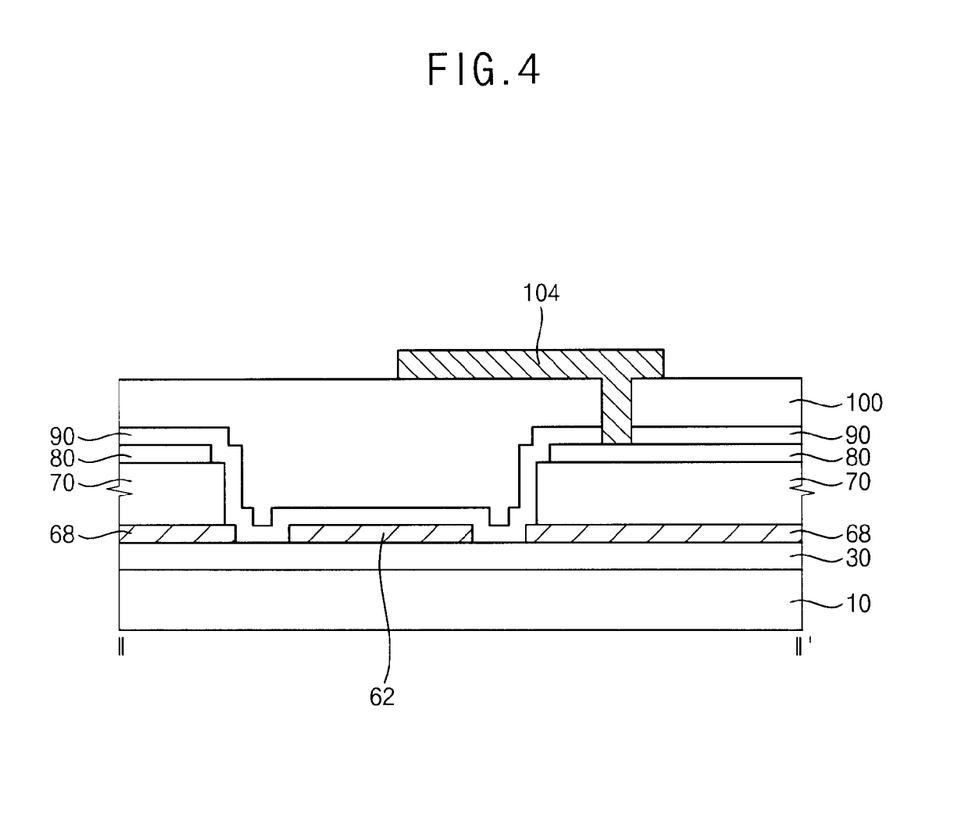
FIG. 4 is a cross-sectional view taken along a line II-II' of FIG. 3.

FIG. 3 is a plan view illustrating another exemplary embodiment of a TFT array substrate for an X-ray detector according to the present invention. FIG. 4 is a cross-sectional view taken along a line II-II' of FIG. 3.

According to an exemplary embodiment, an aperture ratio of the pixel in the X-ray detector corresponds to a fill factor. The fill factor means a ratio of the area of the pixel sensitive to light. The fill factor of the X-ray detector is defined as the area of the PIN photodiode in one pixel area. Thus, sizes of the gate wiring 20, the data wiring 60 and the TFT are decreased to increase the fill factor, so that the area of the PIN photodiode in one pixel area may be increased. However, according to an exemplary embodiment, the area of the PIN photodiode may not be increased over a specified area, and may be limited by a design rule.

Thus, referring to FIGS. 3 and 4, according to an exemplary embodiment, the bias wiring 104 partially overlaps with the data wiring 62, so that the area of the PIN photodiode is maximized. As illustrated in FIG. 4, although the bias wiring 104 partially overlaps with the data wiring 62, the organic insulating layer 100 is integrated on the passivation insulating layer 90 as the insulating interlayer, so that a parasitic capacitance is minimized.

Figure 5:
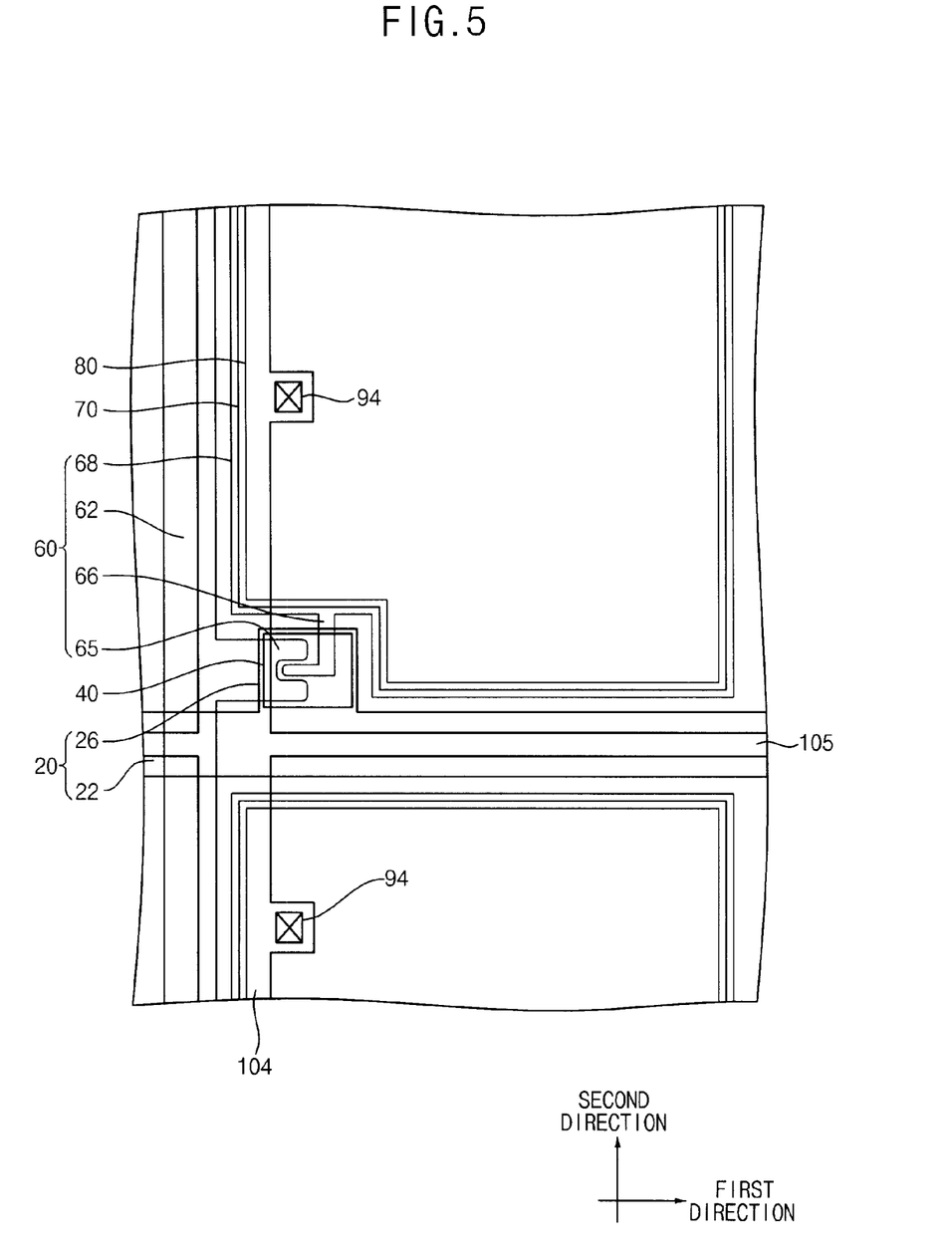
FIG. 5 is a plan view illustrating another exemplary embodiment of a TFT array substrate for an X-ray detector according to the present invention.

FIG. 5 is a plan view illustrating another exemplary embodiment of a TFT array substrate for an X-ray detector according to the present invention.

Referring to FIG. 5, the TFT array substrate for the X-ray detector includes an auxiliary bias wiring 105 to prevent a malfunction of the TFT array substrate when the bias wiring 104 is disconnected.

When the bias wiring 104 is disconnected at one point of the first line due to external impurity particles, the disconnection of the bias wiring 104 may be fixed by applying the bias voltage along the second direction. However, when the bias wiring 104 is continuously disconnected at more than two points in the first line, the disconnection of the bias wiring 104, especially the pixel between two points, may not be fixed even if the bias voltage is applied along the second direction.

Thus, as illustrated in FIG. 5, the auxiliary bias wiring 105 is formed to be electrically connected to the bias wiring 104 and to be substantially perpendicular to the bias wiring 104, so that the efficiency of the TFT array substrate for the X-ray detector may be enhanced. In addition, according to the current exemplary embodiment, the auxiliary bias wiring 105 overlaps with the gate line 22 to enhance the aperture ratio of the auxiliary bias wiring 105.

Figure 6:
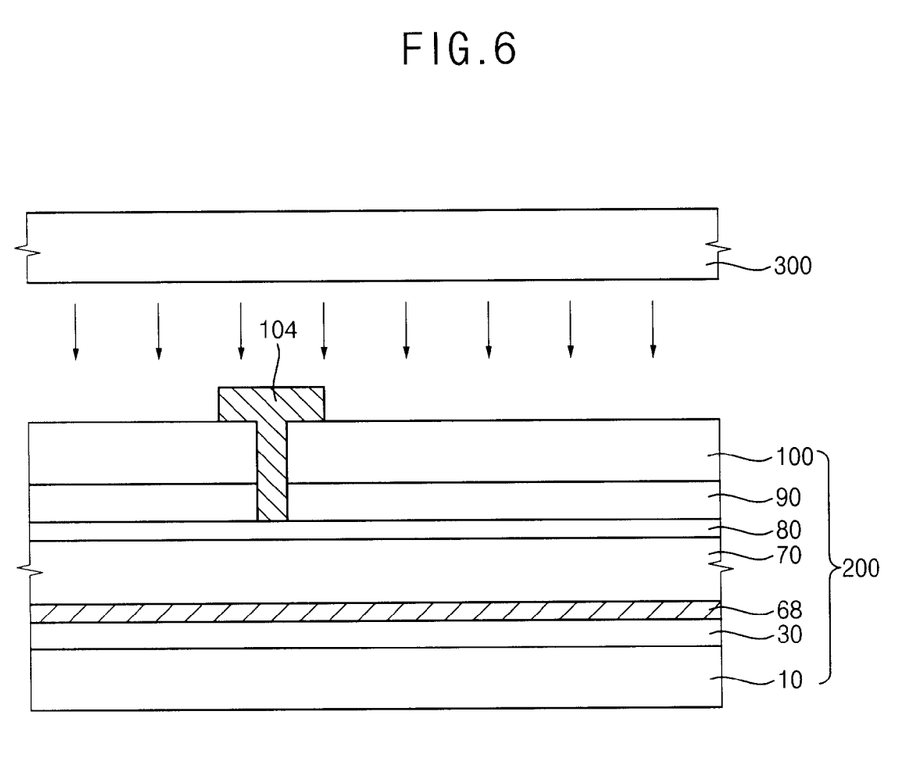
FIG. 6 is a cross-sectional view illustrating an exemplary embodiment of an X-ray detector having the TFT array substrate shown in FIG. 1.

FIG. 6 is a cross-sectional view illustrating an exemplary embodiment of an X-ray detector having the TFT array substrate shown in FIG. 1, according to the present invention. The TFT array substrate of FIG. 6 is substantially the same as in FIG. 1. Thus, the same reference numerals will be used to refer to the same or like parts as those described in FIG. 1 and any further explanation concerning the above elements will be omitted.

Referring to FIG. 6, an X-ray generator 300 generates an X-ray, and the X-ray is irradiated onto an TFT array substrate 200.

According to the TFT array substrate 200 for the X-ray detector of the present invention, when a passivation insulating layer 90 and an organic insulating layer 100 are used at the same time, a bias wiring partially overlaps with a data wiring, so that the area of a PIN photodiode may be maximized and leakage current may be minimized. Thus, the electric characteristics of the X-ray detector may be enhanced.

In addition, an auxiliary bias wiring is also formed, to enhance the reliability of the X-ray detector.

While the present invention has been shown and described with reference to some exemplary embodiments thereof, it should be understood by those of ordinary skill in the art that various changes in form and detail may be made therein without departing from the spirit and scope of the present invention as defined by appended claims.

What is claimed is:

1. A thin-film transistor array substrate for an X-ray detector, the TFT array substrate comprising:
   a gate wiring formed on an insulating substrate, and comprising a gate line and a gate electrode electrically connected to the gate line;
   a gate insulating layer which covers the gate wiring;
   an active layer formed on the gate insulating layer to overlap with the gate electrode;

a data wiring formed on the gate insulating layer, and comprising a data line, a source electrode and a drain electrode, the data line crossing the gate line, the source electrode being electrically connected to the data line and extending to an upper portion of the active layer, and the drain electrode being spaced apart from the source electrode on the active layer;

a photodiode formed in a pixel area, and comprising a lower electrode electrically connected to the drain electrode, a photoconductive layer formed on the lower electrode, which generates electrons and holes using externally provided light, and an upper electrode formed on the photoconductive layer;

an organic insulating layer which covers the data wiring and the photodiode, and comprises a contact hole; and a bias wiring formed on the organic insulating layer and electrically connected to the upper electrode through the contact hole formed through the organic insulating layer, wherein the bias wiring partially overlaps the data line.

2. The thin-film transistor array substrate of claim 1, wherein the bias wiring extends parallel with the data line.

3. The thin-film transistor array substrate of claim 2, further comprising a passivation insulating layer formed beneath the organic insulating layer, which contacts the organic insulating layer.

4. The thin-film transistor array substrate of claim 3, further comprising an auxiliary bias wiring electrically connected to the bias wiring and substantially perpendicularly crossing the bias line.

5. The thin-film transistor array substrate of claim 4, wherein at least a portion of the auxiliary bias wiring overlaps with the gate line.

6. The thin-film transistor array substrate of claim 5, wherein the organic insulating layer comprises a thickness between approximately 2 μm and approximately 3 μm.

7. The thin-film transistor array substrate of claim 2, further comprising an auxiliary bias wiring electrically connected to the bias wiring and perpendicularly crossing the bias wiring, which prevents a malfunction of the thin-film transistor array substrate when the bias wiring becomes disconnected.

8. The thin-film transistor array substrate of claim 1, further comprising a passivation insulating layer formed beneath the organic insulating layer, which contacts the organic insulating layer.

9. The thin-film transistor array substrate of claim 8, wherein the organic insulating layer comprises a low dielectric constant and a thickness greater than approximately 2 μm on the passivation insulating layer.

10. The thin-film transistor array substrate of claim 9, wherein when the passivation insulating layer and the organic insulating layer are used, the organic insulating layer comprises a low dielectric constant which is equal to or lower than approximately 4.0 and comprises a thickness equal to or greater than approximately 2 μm.

11. The thin-film transistor array substrate of claim 8, wherein the contact hole is formed through the passivation insulating layer and the organic insulating layer, to partially expose the upper electrode.

12. The thin-film transistor array substrate of claim 8, further comprising an auxiliary bias wiring electrically connected to the bias wiring and perpendicularly crossing the bias wiring, which prevents a malfunction of the thin-film transistor array substrate when the bias wiring becomes disconnected.

13. the thin-film transistor array substrate of claim 12, wherein the auxiliary bias wiring overlaps with the gate line.

14. The thin-film transistor array substrate of claim 1, wherein the data line extends in a first direction and the gate line extends in a second direction, and the bias wiring extends along the second direction and is formed on the organic insulating layer, such that the bias wiring contacts with the upper electrode through the contact hole, transmits a bias voltage to the upper electrode and controls the electrons and holes generated from the photoconductive layer.

15. The thin-film transistor array substrate of claim 1, wherein the data wiring is connected to an end portion of the data line and further comprises a data pad which receives an externally provided image signal, and the data wiring is formed in the pixel area on the gate insulating layer.

16. The thin-film transistor array substrate of claim 1, wherein the photodiode is a positive-intrinsic-negative photodiode, and contacts the organic insulating layer.

17. An X-ray detector comprising:
a thin-film transistor array substrate comprising:
a gate wiring formed on an insulating substrate, and comprising a gate line and a gate electrode electrically connected to the gate line;
a gate insulating layer which covers the gate wiring;
an active layer formed on the gate insulating layer to overlap with the gate electrode;
a data wiring formed on the gate insulating layer, and comprising a data line, a source electrode and a drain electrode, the data line crossing the gate line, the source electrode being electrically connected to the data line and extending to an upper portion of the active layer, and the drain electrode being spaced apart from the source electrode on the active layer;
a photodiode formed in a pixel area, and comprising a lower electrode electrically connected to the drain electrode, a photoconductive layer formed on the lower electrode, which generates electrons and holes using externally provided light and an upper electrode formed on the photoconductive layer;
an organic insulating layer which covers the data wiring and the photodiode and comprising a contact hole; and
a bias wiring formed on the organic insulating layer and electrically connected to the upper electrode through the contact hole formed through the organic insulating layer; and
an X-ray generator which generates an X-ray and irradiates the X-ray onto the TFT array substrate,
wherein the bias wiring, partially overlaps the data line.

* * * * *